(12) United States Patent
Ogawa et al.

(10) Patent No.: US 11,398,447 B2
(45) Date of Patent: Jul. 26, 2022

(54) SEMICONDUCTOR DEVICE AND METHOD FOR PRODUCING SEMICONDUCTOR DEVICE

(71) Applicant: Mitsubishi Electric Corporation, Tokyo (JP)

(72) Inventors: Shohei Ogawa, Tokyo (JP); Junji Fujino, Tokyo (JP); Satoru Ishikawa, Tokyo (JP); Takumi Shigemoto, Tokyo (JP); Yusuke Ishiyama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 15 days.

(21) Appl. No.: 16/755,951

(22) PCT Filed: Nov. 29, 2018

(86) PCT No.: PCT/JP2018/043995
§ 371 (c)(1),
(2) Date: Apr. 14, 2020

(87) PCT Pub. No.: WO2019/116910
PCT Pub. Date: Jun. 20, 2019

(65) Prior Publication Data
US 2021/0193611 A1    Jun. 24, 2021

(30) Foreign Application Priority Data

Dec. 13, 2017   (JP) .............................. JP2017-238290

(51) Int. Cl.
*H01L 23/00*    (2006.01)
*B23K 1/00*    (2006.01)
(Continued)

(52) U.S. Cl.
CPC ............ *H01L 24/32* (2013.01); *B23K 1/0016* (2013.01); *B23K 1/0056* (2013.01);
(Continued)

(58) Field of Classification Search
CPC . H01L 2224/29111; H01L 2224/29139; H01L 2224/29147
See application file for complete search history.

(56) References Cited

U.S. PATENT DOCUMENTS

2006/0049521 A1    3/2006   Kayukawa et al.
2007/0176293 A1    8/2007   Kayukawa et al.
(Continued)

FOREIGN PATENT DOCUMENTS

DE    102005042780 A1    3/2006
DE    102012100137 A1    7/2012
(Continued)

OTHER PUBLICATIONS

International Search Report (PCT/ISA/210) dated Feb. 19, 2019, by the Japan Patent Office as the International Searching Authority for International Application No. PCT/JP2018/043995.
(Continued)

*Primary Examiner* — Dale E Page
*Assistant Examiner* — Wilner Jean Baptiste
(74) *Attorney, Agent, or Firm* — Buchanan Ingersoll & Rooney PC

(57) ABSTRACT

A semiconductor device includes an insulating substrate formed by integrating a ceramic base plate and a cooling fin; a multiple of plate interconnection members; and a plurality of semiconductor elements. The one faces of the semiconductor elements are bonded to the ceramic base plate of the insulating substrate with a chip-bottom solder, and the other faces thereof are bonded to the plate-interconnection members with a chip-top solder so that plate interconnection members correspond respectively to the semiconductor elements. The chip-bottom solder and the chip-top solder both contain mainly Sn and 0.3-3 wt. % Ag and 0.5-1 wt. % Cu.
(Continued)

This allows the semiconductor device to be reduced in size without impairing heat dissipation.

20 Claims, 15 Drawing Sheets

(51) Int. Cl.
| | |
|---|---|
| *B23K 1/005* | (2006.01) |
| *B23K 35/26* | (2006.01) |
| *C22C 13/00* | (2006.01) |
| *H01L 23/053* | (2006.01) |
| *H01L 23/373* | (2006.01) |
| *H01L 23/492* | (2006.01) |
| *H01L 25/07* | (2006.01) |
| *B23K 101/40* | (2006.01) |

(52) U.S. Cl.
CPC ............ *B23K 35/262* (2013.01); *C22C 13/00* (2013.01); *H01L 23/053* (2013.01); *H01L 23/3735* (2013.01); *H01L 23/492* (2013.01); *H01L 24/29* (2013.01); *H01L 24/83* (2013.01); *H01L 25/072* (2013.01); *B23K 2101/40* (2018.08); *H01L 2224/29111* (2013.01); *H01L 2224/29139* (2013.01); *H01L 2224/29147* (2013.01); *H01L 2224/32245* (2013.01); *H01L 2224/83815* (2013.01)

(56) References Cited

U.S. PATENT DOCUMENTS

| | | |
|---|---|---|
| 2010/0134994 A1 | 6/2010 | Lee |
| 2011/0204121 A1 | 8/2011 | Kawamata et al. |
| 2012/0181679 A1 | 7/2012 | Kadoguchi et al. |
| 2015/0034367 A1* | 2/2015 | Nagatomo ............. B23K 1/012 174/252 |
| 2015/0145356 A1* | 5/2015 | Soulier ..................... H02K 5/18 310/54 |
| 2015/0223316 A1* | 8/2015 | Fujino ..................... H01L 25/18 361/717 |
| 2016/0071778 A1* | 3/2016 | Otsubo ................... H01L 21/52 257/687 |
| 2016/0079155 A1 | 3/2016 | Kawase et al. |
| 2016/0104651 A1 | 4/2016 | Asada et al. |

FOREIGN PATENT DOCUMENTS

| | | |
|---|---|---|
| DE | 112013007047 T5 | 1/2016 |
| JP | 2003218508 A | 7/2003 |
| JP | 2003273165 A | 9/2003 |
| JP | 2005183568 A | 7/2005 |
| JP | 2007157863 A | 6/2007 |
| JP | 2008282834 A | 11/2008 |
| JP | 2009021530 A | 1/2009 |
| JP | 2010135783 A | 6/2010 |
| JP | 2010238963 A | 10/2010 |
| JP | 2016076670 A | 5/2016 |
| JP | 2016178261 A | 10/2016 |
| JP | 6065973 B2 | 1/2017 |

OTHER PUBLICATIONS

Written Opinion (PCT/ISA/237) dated Feb. 19, 2019, by the Japan Patent Office as the International Searching Authority for International Application No. PCT/JP2018/043995.

Office Action dated May 3, 2022, issued in the corresponding German Patent Application No. 112018006382.8, 7 pages of Official Copy Only.

* cited by examiner

SEMICONDUCTOR DEVICE AND METHOD FOR PRODUCING SEMICONDUCTOR DEVICE

TECHNICAL FIELD

The present application relates to a semiconductor device that has a structure such that a plate interconnection member are soldered to the chip and relates to a method for producing the semiconductor device.

BACKGROUND ARTS

In power semiconductor devices, heat resistance is reduced by directly soldering a semiconductor chip to an insulating substrate integrated with a cooling fin. Moreover, the semiconductor module is reduced in size by employing a structure such that the interconnection on the chip is established not by wire-bonding but by soldering a lead.

Patent Document 1 discloses a module structure that enables thermal resistance to be reduced more by mounting the chip on an insulating substrate integrated with a cooling fin than by mounting it on a substrate being in contact with a fin via grease and thereby enables reduction in size. Patent Documents 1 and 2 disclose module structures that enable the current density to be increased more by establishing the interconnection on the chip by soldering a plate interconnection member compared with by wire bonding and thereby enable reduction in size. Furthermore, Patent Documents 2 and 3 disclose a module in which a Sn—Ag—Cu based solder is used for bonding the chip to the substrate and the lead to the chip.

PRIOR ART DOCUMENTS

Patent Documents

Patent Document 1: JP6065973 B (Paragraphs [0012] to and FIG. 1)
Patent Document 2: JP2007-157863 A (Paragraphs [0012] to [0013] and FIG. 1)
Patent Document 3: JP2005-183568 A (Paragraph [0008] and FIG. 1)

SUMMARY OF THE INVENTION

Problem that the Invention is to Solve

Employing the structures disclosed in Patent Documents 1 to 3, however, since when the chip is soldered to the insulating substrate, the cooling rate is more decreased because of a large heat capacity due to the cooling fin and the decreased contact area with a cooling plate owing to the fin compared with a case of the cooling fin being a flat plate, a shrinkage cavity may sometimes occur& occur in the solder between the chip and the insulating substrate integrated with the cooling fin, thus raising a problem of impairing heat dissipation.

The present application is aimed at resolving the above-described mentioned problem, and at providing a semiconductor device that can be reduced in size without impairing heat dissipation and a method for producing the semiconductor device.

Means for Solving the Problem

According to an aspect disclosed herein, a semiconductor device includes a substrate formed by integrating an insulating member and a cooling fin; a plate interconnection member; and a semiconductor element whose back face is bonded with a first solder to interconnection pattern formed on the insulating member of the substrate and whose front face is bonded to the plate interconnection member with a second solder so that the plate interconnection member correspond to the semiconductor element, wherein the first solder contains mainly Sn, 0.3-3 wt. % Ag and 0.5-1 wt. % Cu, and wherein when Al metal film is formed on the front face of the semiconductor element, the second solder contains mainly Sn, 0.3-2 wt. % Ag and 0.5-1 wt. % Cu. Further, a semiconductor device includes a substrate formed by integrating an insulating member and a cooling fin; a plate interconnection member; and a semiconductor element whose back face is bonded with a first solder to interconnection pattern formed on the insulating member of the substrate and whose front face is bonded to the plate interconnection member with a second solder so that the plate interconnection member correspond to the semiconductor element, wherein the first solder contains mainly Sn, 0.3-2 wt. % Ag and 0.5-1 wt. % Cu, and wherein the substrate is provided with metal films formed on the interconnection pattern on the insulating member bonded to the back face of the semiconductor element with the first solder via the metal film, and the semiconductor element is provided with metal film formed on the back face bonded to the insulating member with the first solder via the metal film, and wherein at least either one of the metal film on the back face of the semiconductor element and the metal film on the interconnection pattern on the insulating member is formed of Ag or Cu.

According to another aspect disclosed herein, a method of fabricating the semiconductor device includes the steps of: bonding back face of semiconductor element, with a first solder through a first reflow, to interconnection pattern on an insulating member of a substrate formed by integrating the insulating member and a cooling fin; and bonding a plate interconnection member to front face of the semiconductor element with a second solder through a second reflow so that the plate interconnection member correspond to the semiconductor element, wherein the first solder contains mainly Sn, 0.3-3 wt. % Ag and 0.5-1 wt. % Cu, and wherein when Al metal film is formed over the front face of the semiconductor element, the second solder contains mainly Sn, 0.3-2 wt. % Ag and 0.5-1 wt. % Cu.

According to further aspect disclosed herein, a method for producing the semiconductor device includes bonding metal films formed on back faces of semiconductor elements, with a first solder through a first reflow, to metal films formed on interconnection patterns on an insulating member of a substrate formed by integrating the insulating member and a cooling fin; and bonding metal films formed over front faces of the semiconductor elements, with a second solder through a second reflow, to plate interconnection members so that the plate interconnection members correspond to the semiconductor elements, wherein at least either one of the metal films on a back face of semiconductor elements and the metal films formed on the interconnection patterns on the insulating members of the substrate is formed of Ag, and a solder containing mainly Sn and 0.5-1 wt. % Cu is used as the first solder so that the first solder becomes a solder containing mainly Sn, 0.3-3 wt. % Ag and 0.5-1 wt. % Cu during the first reflow in the step of bonding with the first solder.

According to still another aspect disclosed herein, a method for producing the semiconductor device includes bonding, metal films formed on a back face of semiconductor elements, with a first solder through a first reflow, to metal films formed on interconnection patterns on an insulating member of a substrate formed by integrating an insulating member and a cooling fin; and bonding plate interconnection members, with a second solder through a second reflow, to metal films formed over front faces of the semiconductor elements so that the plate interconnection members correspond to the semiconductor elements, wherein at least either one of the metal films on a back face of semiconductor elements and the metal films formed on the interconnection patterns on the insulating members of the substrate is formed of Cu, and a solder containing mainly Sn and 0.3-3 wt. % Ag is used as the first solder so that the first solder becomes a solder containing mainly Sn, 0.3-3 wt. % Ag and 0.5-1 wt. % Cu during the first reflow in the step of bonding with the first solder.

Advantage Effect of the Invention

According to the present application, occurrence of a shrinkage cavity can prevent by using a solder containing mainly Sn, and 0.3-3 wt. % Ag and 0.5-1 wt. % Cu for bonding the semiconductor element, thus being able to reduce a semiconductor module in size without impairing heat dissipation.

EMBODIMENTS FOR CARRYING OUT THE INVENTION

Embodiment 1

Figure 1:
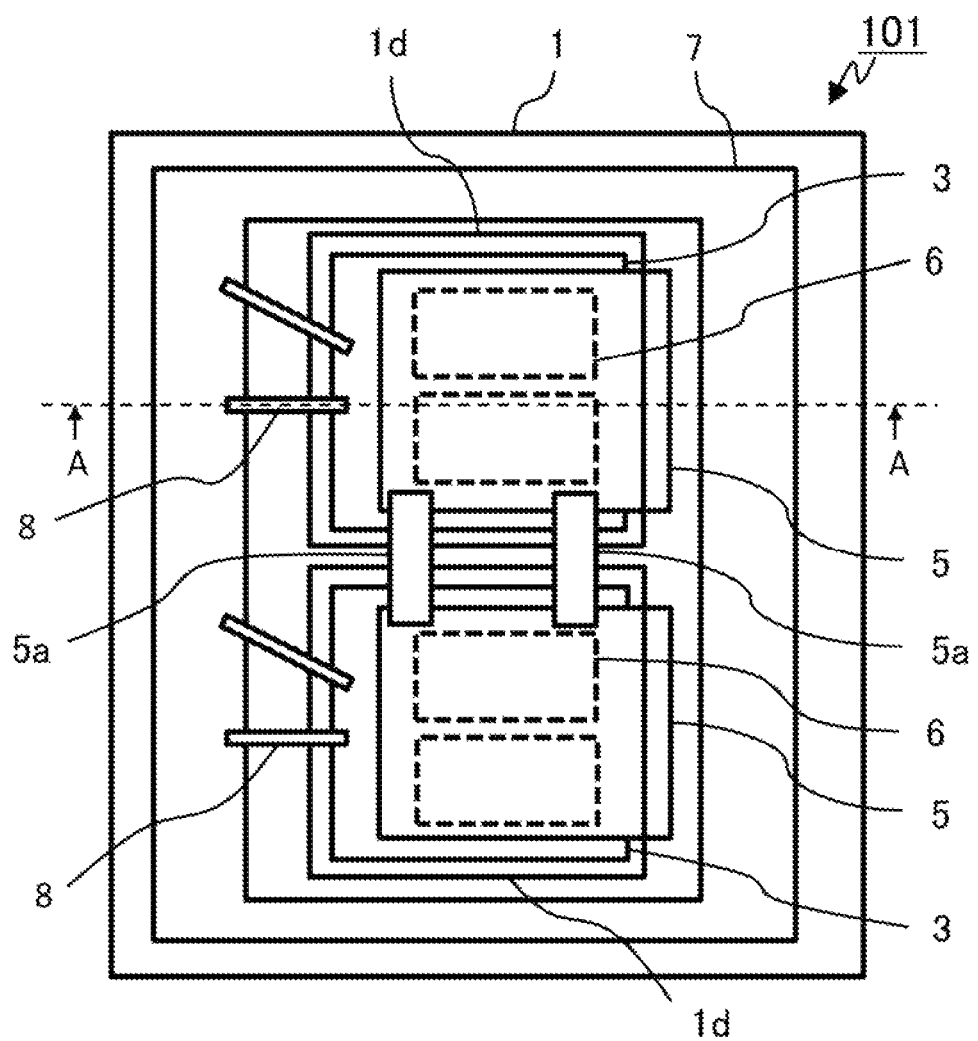
FIG. 1 is a schematic plan view showing a configuration of the main portion of a semiconductor device according to Embodiment 1.

A configuration of a semiconductor device according to Embodiment 1 is described with reference to the drawings. Note that the same reference numerals are assigned to the same or similar constituents in each drawing. The depicted size of each corresponding component and the scale of each corresponding configuration between the figures are independent of each other; for example, between the cross-sections showing part of configuration being altered and unaltered, the depicted sizes of the same components and the scales of the same configurations may be different from each other. While the semiconductor device further includes a plurality of components in an actual configuration, only components necessary for the description are illustrated and other components (such as, for example, an external terminal) are omitted from illustration for the sake of simplicity. Furthermore, while in an actual configuration, the same components are connected in parallel or the switching elements are connected in series to the rectifier elements such as diodes, these are also omitted from illustration for the sake of simplicity.

Figure 2:
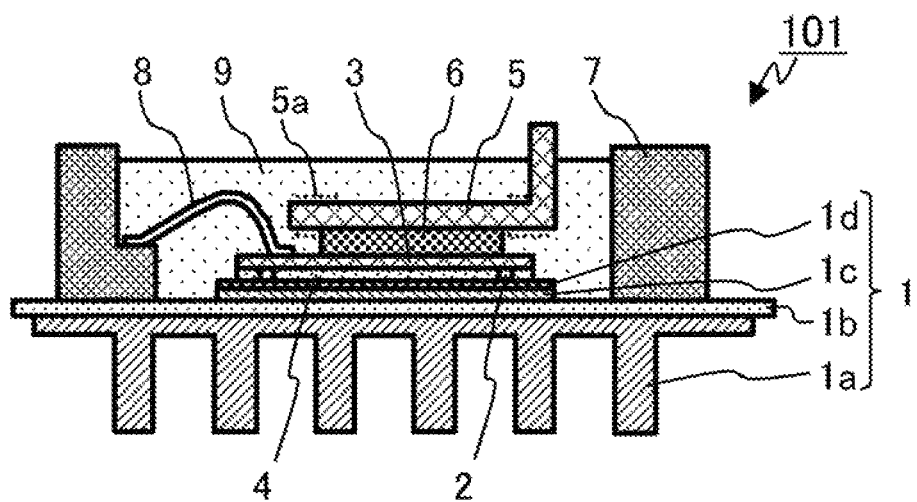
FIG. 2 is a schematic cross-sectional view showing the configuration of the main portion the semiconductor device of Embodiment 1.

FIG. 1 is a top plan view of the semiconductor device 101 according to Embodiment 1. FIG. 2 is a cross-sectional view taken in the direction the arrows on line A-A of FIG. 1. As shown in FIGS. 1 and 2, the semiconductor device 101 includes an insulating substrate 1 integrated with a cooling fin 1a, chips 3, plate interconnection members 5 for electrically connecting the chips 3 to the external, wires 8, and a resin sealing portion 9 encapsulating the connecting portions of the chips 3 in a casing 7.

The insulating substrate 1 includes an AlN ceramic base plate 1b (size: 100 mm long×100 mm wide and 0.6 mm thick) as an insulating member and an Al cooling fin 1a formed together with the AlN ceramic base plate 1b on the back face thereof, and is provided with an Al electrode pattern 1c as an interconnection pattern on the front face thereof. The ceramic base plate 1b and the cooling fin 1a are formed integrally by casting. The front face of the electrode pattern 1c is coated with a Ni metal film of 5 μm thickness 1d to ensure a good bonding with a chip-bottom solder 4 as a first solder.

Figure 3:
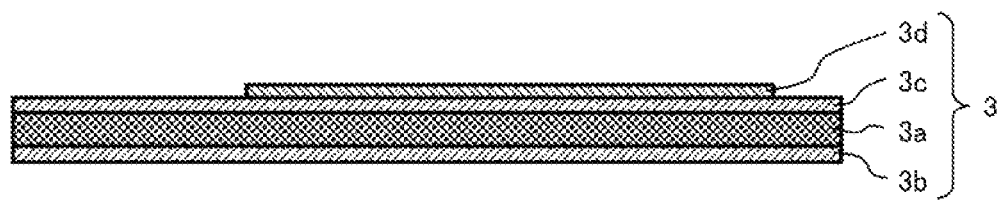
FIG. 3 is a schematic cross-sectional view showing a chip configuration of the semiconductor device of Embodiment 1.

FIG. 3 shows a cross-sectional view of the chip 3. The chip 3 has an Al-metal film 3c on the front face of a semiconductor element 3a and the Al-metal film 3c is coated with a Ni metal film 3d to ensure a good bonding to the plate interconnection member 5 with a chip-top solder 6 as a second solder. The rear surface of the semiconductor element is also coated with a Ni-metal electrode film 3b to ensure a good bonding to the insulating substrate 1 with the chip-bottom solder 4.

An Si insulated gate bipolar transistor (IGBT; size: 15 mm long×15 mm wide and 100 μm thickness) is used as the semiconductor element 3c. Al wire spacers 2 (100 μm diameter) are disposed at the four corners on the electrode pattern 1c of the substrate 1 to position the chip 3, and the plurality of chips 3 are die-bonded on the spacers with the chip-bottom solder 4 (Sn, 0.3-2 wt. % Ag, 0.5-1 wt. % Cu).

The interconnection member 5 is formed of Cu plate electrode (1 mm thickness) and bonded to the metal film 3d as the front face electrode of each chip 3 with the chip-top solder 6 (Sn, 0.3-2 wt. % Ag, 0.5-1 wt. % Cu). The end not connected with the chip 3, of the plate interconnection member 5 serves as an external electrode. While the plate interconnection member 5 is used for the interconnection on the chip 3 from the view point of size reduction of the module in Embodiment 1, wire connection can be employed as the interconnection on the chip 3.

The casing 7 is formed of polyphenylene sulfide (PPS) resin and in a box shape. The bottom of the casing 7 is bonded to the insulating substrate 1 such as with an adhesive. The casing 7 is provided with a Cu terminal connected to an external terminal, and the chip 3 is electrically connected thereto via Al wires 8 (200 μm diameter). The casing 7 is potted with encapsulating resin (epoxy resin).

The resin sealing portion 9 formed by potting the epoxy resin in the casing 7, seals and insulates the front face of the insulating substrate 1, the chips 3, interconnection members 5, the wires 8, and the chip-bottom solder 4 and the chip-top solder 6.

Forming the insulating substrate 1 formed by integrating the ceramic base plate 1b and the cooling fin 1a allows heat resistance to be more reduced than a case of putting the fin in contact with the substrate via grease, thereby being able to reduce the size of the module. In comparison with a case of soldering a ceramic base plate to a cooling fin as shown in FIG. 3 of JP2007-157863A, casting together with an insulating material or integrating in advance the insulating substrate and the cooling fin by brazing or like can more reduce the heat resistance and can thereby reduce the module size. Soldering may sometimes cause a void and a shrinkage cavity in the solder layer. Since the heat resistance more increases if they occur, occurrence of such a void and a shrinkage cavity needs to be taken into account for a large module. Furthermore, by establishing the interconnection on the chip 3 by soldering the plate interconnection member 5, the current density can be increased and the module can thereby be reduced in size in comparison with a case of using wire-bonding.

Using the insulating substrate formed by integrating the ceramic base plate 1b and the cooling fin 1a exhibits a good thermal conductivity; however, its cooling rate decreases in comparison with using an insulating substrate having a flat back face with no fins because the cooling fin reduces the contact area with a cooling plate used for cooling after reflow for die-bonding the chip 3. A slow cooling rate is apt to cause a shrinkage cavity due to volume shrinkage in solidification of solder. Although the cooling rate can be increased by combined used of the contact cooling and by blow of nitrogen or the like on the fin, such cooling cannot achieve a cooling rate to the extent of that obtained by putting the entire bottom face of a module having no fins in contact with a cooling plate.

Figure 4:
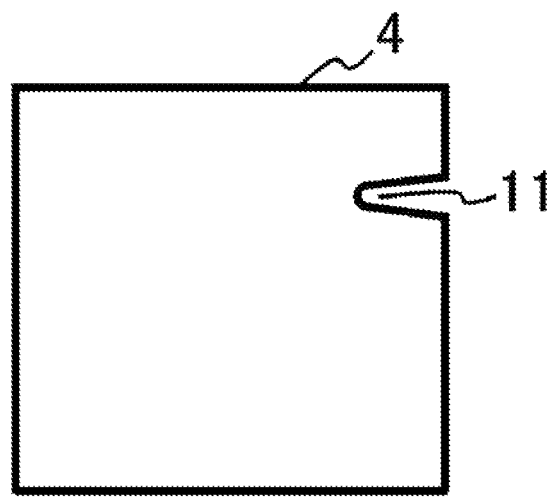
FIG. 4 is a schematic plane view illustrating a shape of a shrinkage cavity in a solder used in a traditional semiconductor device.

FIG. 4 shows a shape of a shrinkage cavity developed in the chip-bottom solder 4. No shrinkage cavity 11 preferably occurs in the chip-bottom solder 4 because if occurs, this raises concern about reduction in heat dissipation. Hence, the inventors found out that occurrence of a shrinkage cavity can be prevented for the configuration of Embodiment 1 by using the chip-bottom solder 4 to have a composition containing Sn, 0.3-2 wt. % Ag, and 0.5-1 wt. % Cu. Moreover, existence of the wire spacers 2 in the chip-bottom solder 4 allows the minimum solder thickness to be ensured and heat dissipation to be prevented from being impaired by a thick portion due to occurrence of thickness deviation in solder. In sum, since a shrinkage cavity tends to occur in a thick region of the solder, by using the chip-bottom solder 4 having a composition containing Sn, 0.3-2 wt. % Ag, 0.5-1 wt. % Cu and disposing the spacers, the solder thickness can be controlled and formation of a thick region due to occurrence of thickness variation can be prevented, thus being able to more suppress a shrinkage cavity from occurring.

Figure 5:
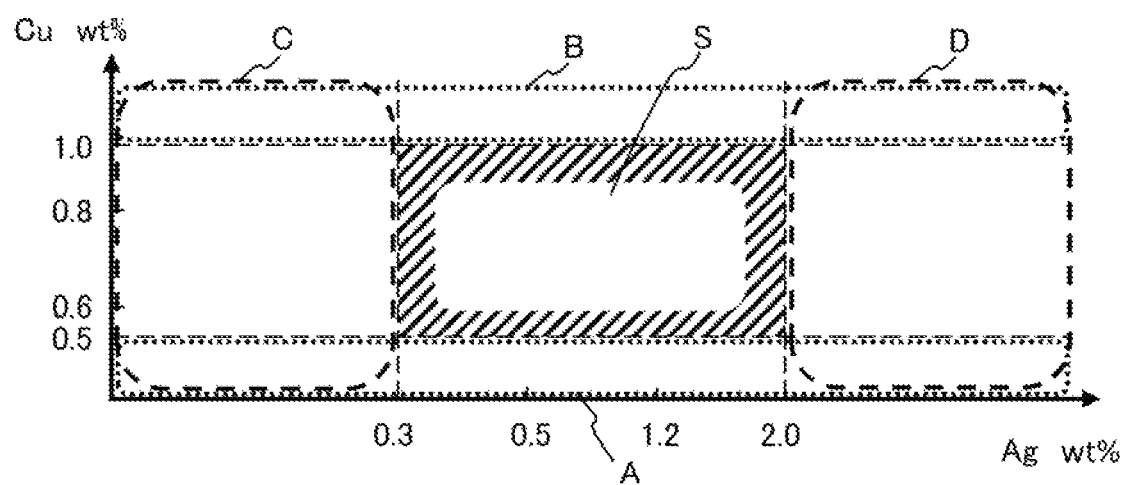
FIG. 5 is a diagram for explaining grounds for a composition of a solder used for semiconductor device according to Embodiment 1.

FIG. 5 shows the evidence for determining as Sn, 0.3-2 wt. % Ag, and 0.5-1 wt. % Cu the compositions of the chip-bottom solder 4 used for the semiconductor device 101 according to Embodiment 1. FIGS. 6 to 9 are flow diagrams showing cause-and-effect relationships in cases of using a solder having composition other than that of the solder 4 used for the semiconductor device according to embodiment 1.

Figure 6:
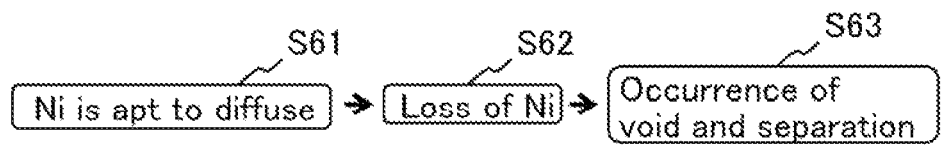
FIG. 6 is a flow diagram showing a cause-and-effect relationship in a case of using a solder having a composition other than that of a solder used for the semiconductor device according to Embodiment 1.
Figure 7:
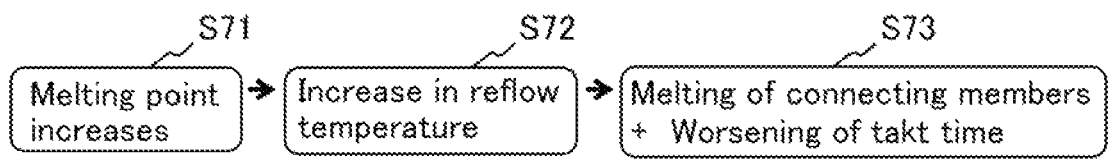
FIG. 7 is a flow diagram showing a cause-and-effect relationship in a case of using a solder having g a composition other than that of the solder used for the semiconductor device according to Embodiment 1.
Figure 10:
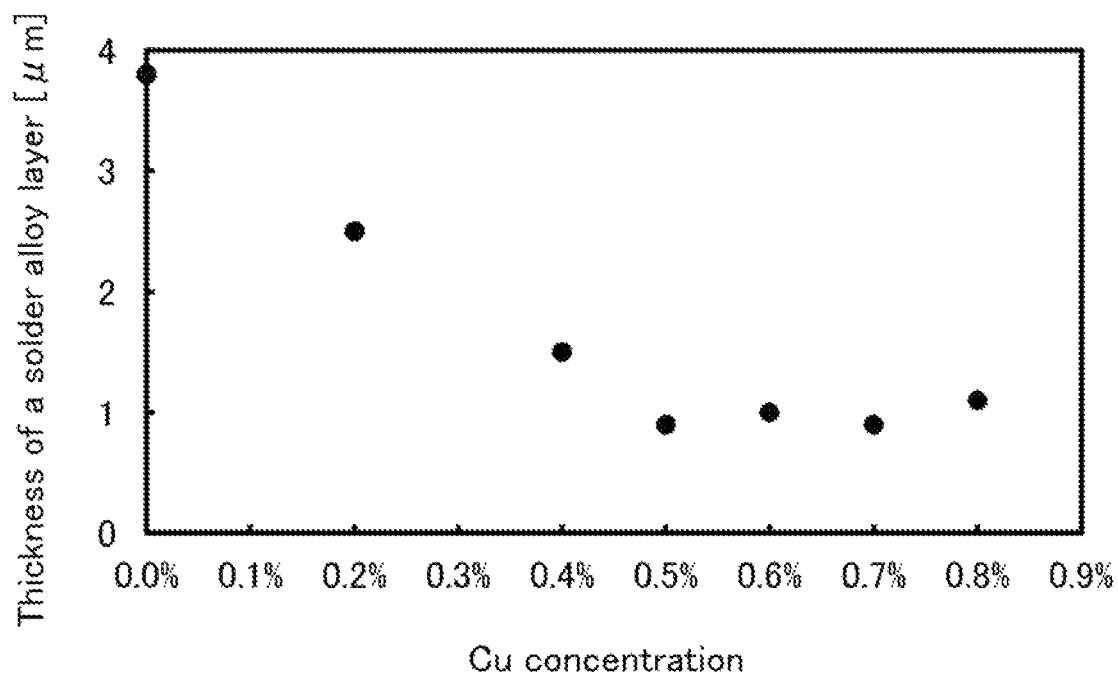
FIG. 10 is a graph showing a relation between a Cu concentration and a thickness of a solder alloy layer, for explaining a situation in a case of using a solder having a composition other than that of the solder used for the semiconductor device according to Embodiment 1.

In a case of the Cu concentration less than 0.5 wt. % (the region A in FIG. 5) with respect to the solder 4 having the composition of Sn, 0.3-2 wt. % Ag, 0.5-1 wt. % (Region S in FIG. 5), there is concern that the Ni metal films 1d and 3b, which are formed to ensure a good bonding of the chip 3 to the electrode pattern 1c of the insulating substrate 1, diffuse (Condition S61) and becomes lost (Condition S62), as shown in the flow diagram of FIG. 6, during melting of the chip-bottom solder 4 in the temperature cycle. FIG. 10 shows dependency of the thickness of a resulting solder alloy layer on a Cu concentration. The alloy layer thickness increases with decreasing Cu concentration in the case of the Cu concentration less than 0.5 wt. %. This indicates that Ni diffuses into the alloy layer and becomes lost. The loss of Ni may sometimes cause separation (Condition S63). Hence, the Cu concentration is preferably 0.5 wt. % or more, and more preferably 0.6 wt. % or more considering composition variation in preparation of the solder.

Figure 11:
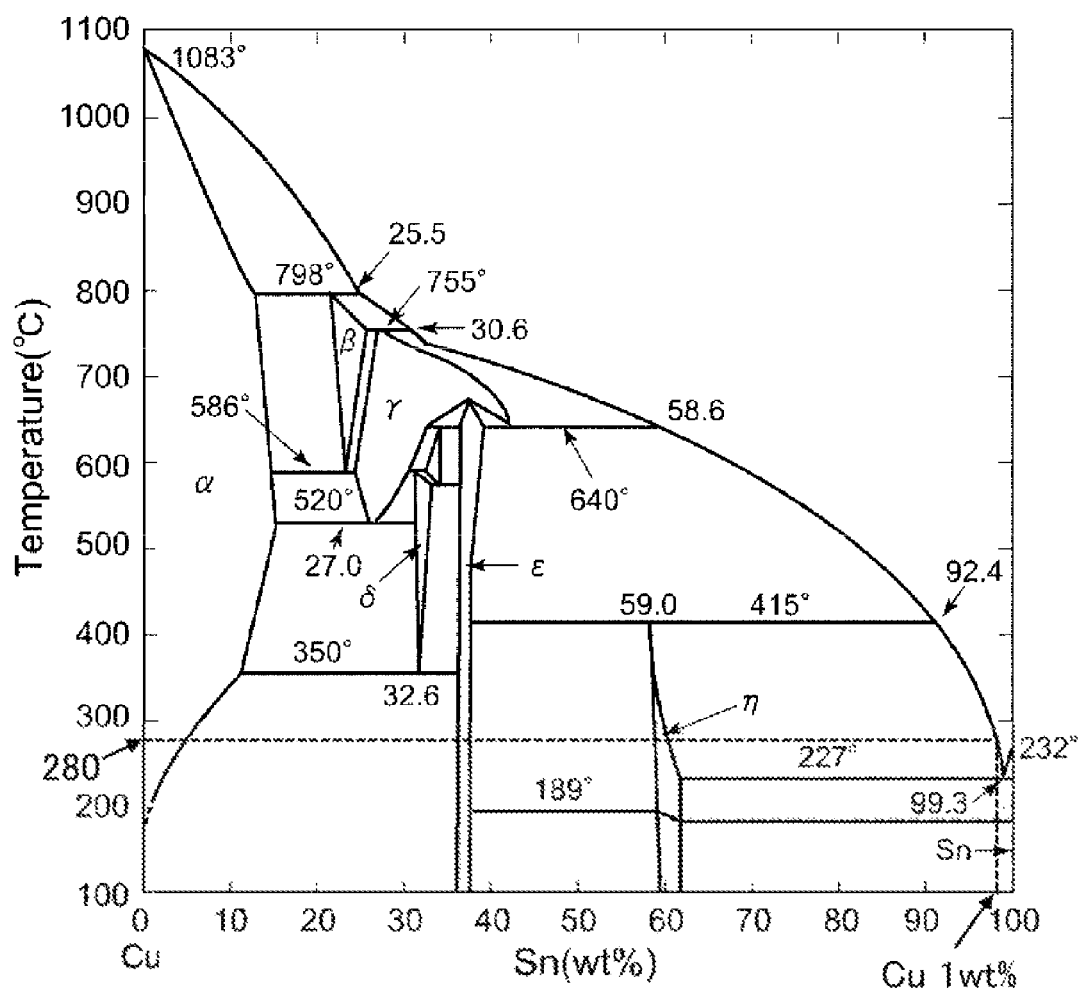
FIG. 11 is a binary phase diagram of Sn—Cu solder, for explaining the composition of the solder used for the semiconductor device according to Embodiment 1.
Figure 12:
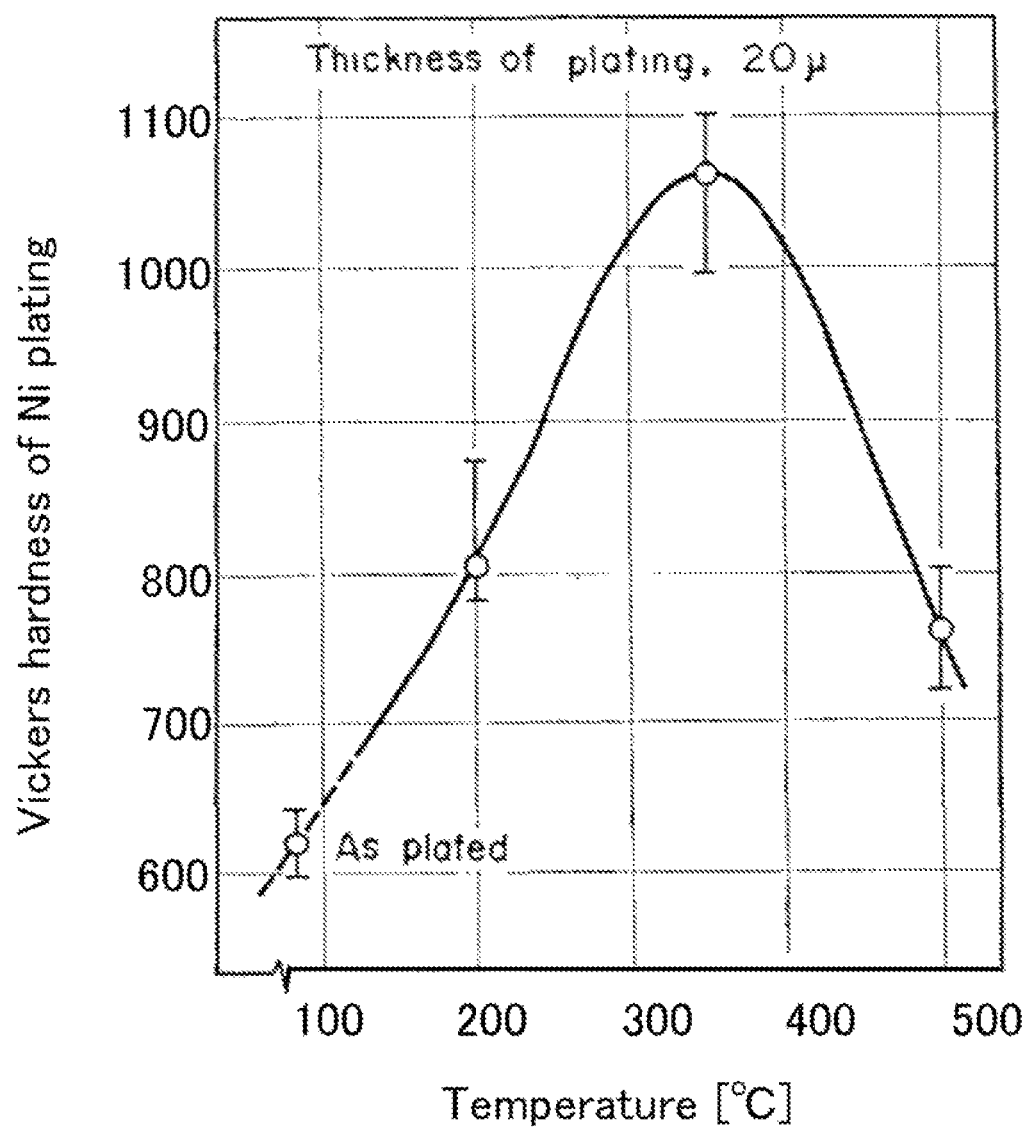
FIG. 12 is a graph showing a relation between temperature and Vickers hardness, for explaining the composition of the solder used for the semiconductor device according to Embodiment 1.

The semiconductor device 101, in a case of mounting a plurality of the chips 3, needs a multiple of the plate interconnection members 5. Using the multiple plate interconnection members beforehand joined in series into one piece with the resin connecting members 5a allows for consolidating positioning pins necessary for the respective interconnection members, thus, being able to reduce the semiconductor device in size accordingly. The interconnection members and the connecting members 5a are joined by, for example, insert molding. However, in a case of the Cu concentration in excess of 1 wt. % (Region B in FIG. 5), the melting point of the chip-bottom solder 4 and the chip-top solder 6 exceeds 280° C. (Condition S71) as shown in the binary phase diagram of Sn—Cu solder (see FIG. 11), and since this temperature higher than the melting point of the PPS connecting member 5a, there is a concern about melting of the resin connecting members 5a joining the plate interconnection members during soldering, as shown in the flow diagram of FIG. 7. Since the temperature inevitably raised in reflow (Condition S72), the heating and cooling takes a long time, i.e., the processing time in the reflow steps becomes long, whereby the productivity is reduced (worsening of takt time; Condition S73). Hence, the Cu concentration is preferably 1 wt. % or less. If the heat capacity of the semiconductor device 101 is large, since reflow is necessarily performed after the solder completely attains its melting temperature and at a temperature that does not melt the resin connecting member 5a, the Cu concentration is preferably 0.8 wt. % or less. Incidentally, it is known that the Ni plating coated over the chip, which is for soldering, increases in Vickers hardness by annealing at 300° C. or higher as shown in FIG. 12. The increase in hardness is due to crystallization. The increase in hardness, however, causes the Ni plating to become brittle and easy to crack, and this raises concern about reduction in reliability. Thus, even if the soldering can be completed without the resin connecting members, it is unpreferable that the melting temperature of the solder increases.

Figure 8:
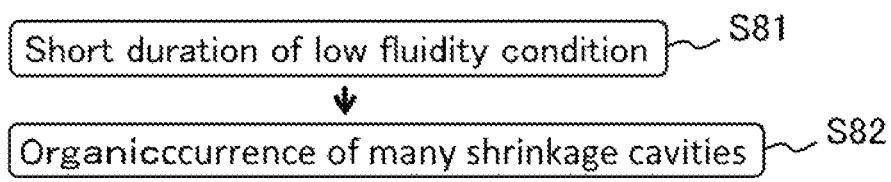
FIG. 8 is a flow diagram showing a cause-and-effect relationship in a case of using a solder having a composition other than that of the solder used for the semiconductor device according to Embodiment 1.
Figure 9:
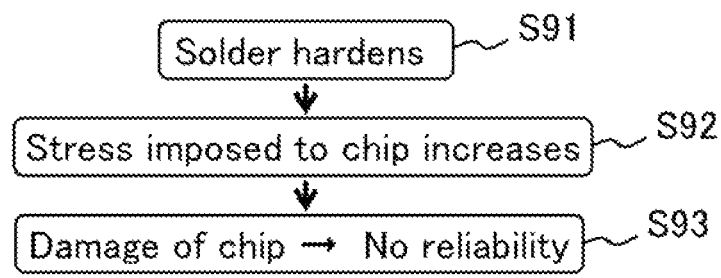
FIG. 9 is a flow diagram showing a cause-and-effect relationship in a case of using a solder having a composition is other than that of the solder used for the semiconductor device according to Embodiment 1.
Figure 13:
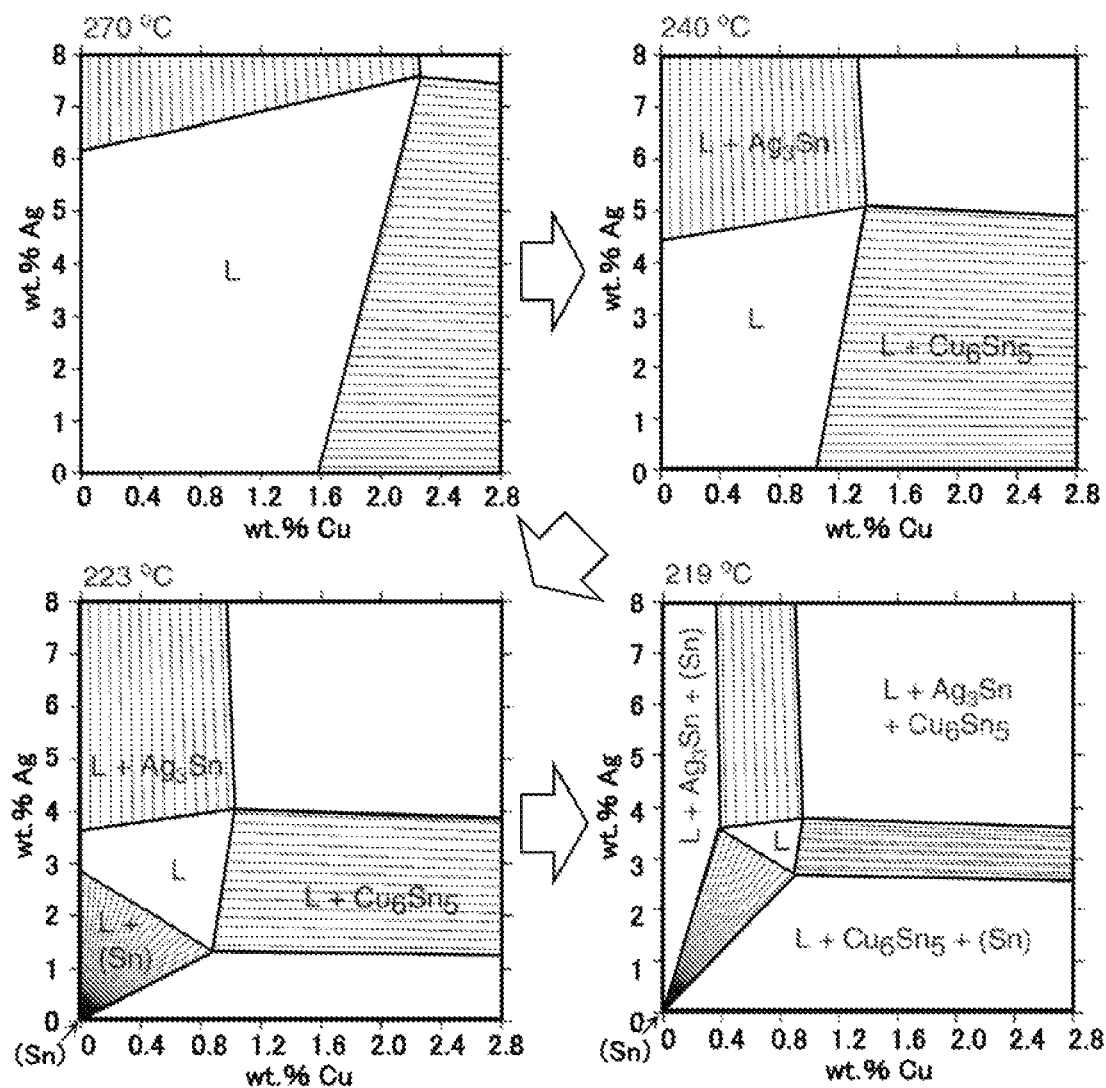
FIG. 13 shows ternary phase diagrams of Sn—Ag—Cu solder, for explaining a composition of the solder used for the semiconductor device according to Embodiment 1.
Figure 14:
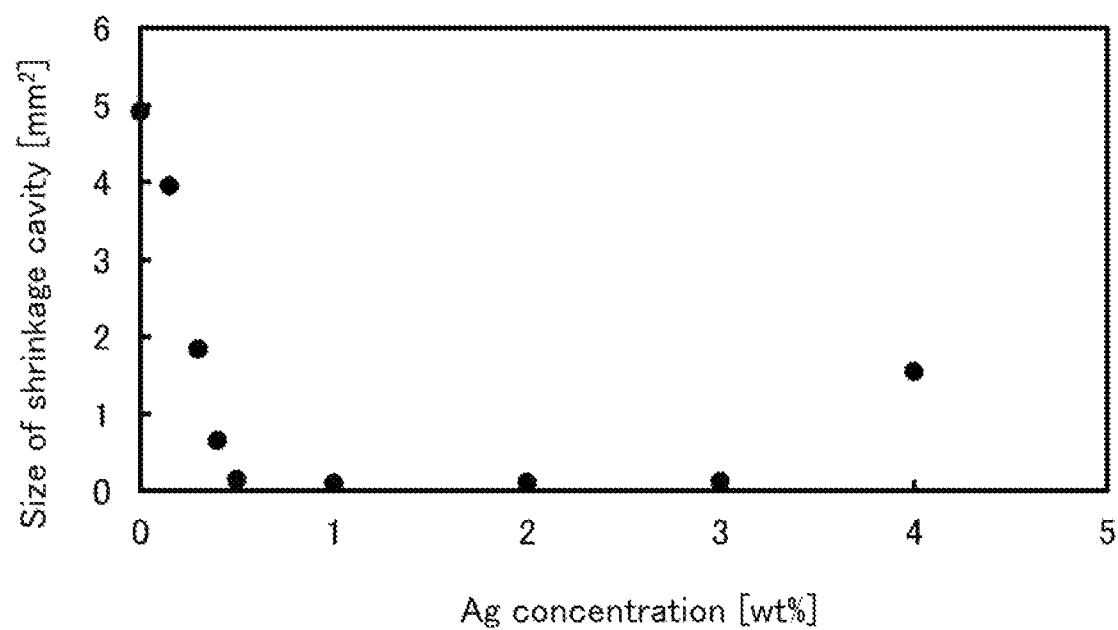
FIG. 14 is a graph for explaining a shrinkage-cavity condition depending on an Ag concentration in the solder used for the semiconductor device according to Embodiment 1.

When the Ag concentration is 0.3-3 wt. %, it is considered from the ternary phase diagram shown in FIG. 13 that Sn crystallizes first and then $Cu_6Sn_5$ and $Ag_3Sn$ crystallize in this order, and since solidification gradually progresses in a low fluidity state, it is considered that a shrinkage cavity is difficult to occur. When the Ag concentration is less than 0.3 wt. % (Region C in FIG. 5), $Cu_6Sn_5$ crystallizes, and when the Ag concentration is in excess of 3 wt. %, $Ag_3Sn$ and Sn crystallize simultaneously. Hence, it is considered that duration of low fluidity condition (Condition S81) is short and a shrinkage cavity is apt to occur (Condition S80, as shown in FIG. 8. In an inventors experimental result of actually die-bonding the chip 3 to the insulating substrate 1 under a temperature profile of a chip cooling rate of 0.5 K/sec, many shrinkage cavities occurred when the Ag concentration was less than 0.3 wt. % and a shrinkage cavity was able to be prevented from occurring when the Ag concentration was in a range of 0.3-3 wt. %, as shown in FIG. 14. Thus, since a shrinkage cavity occurs frequently when the Ag concentration less than 0.3 wt. %, the Ag concentration is preferably 0.3 wt. % or more. In a power semiconductor device capable of a high current output, such as more than 600 A, since the module is large in size to ensure an insulation distance and its heat capacity increases with increasing size, the cooling rate is presumed to become further low. For that case, it is further preferable to contain 0.5 wt. % or more Ag.

Figure 15:
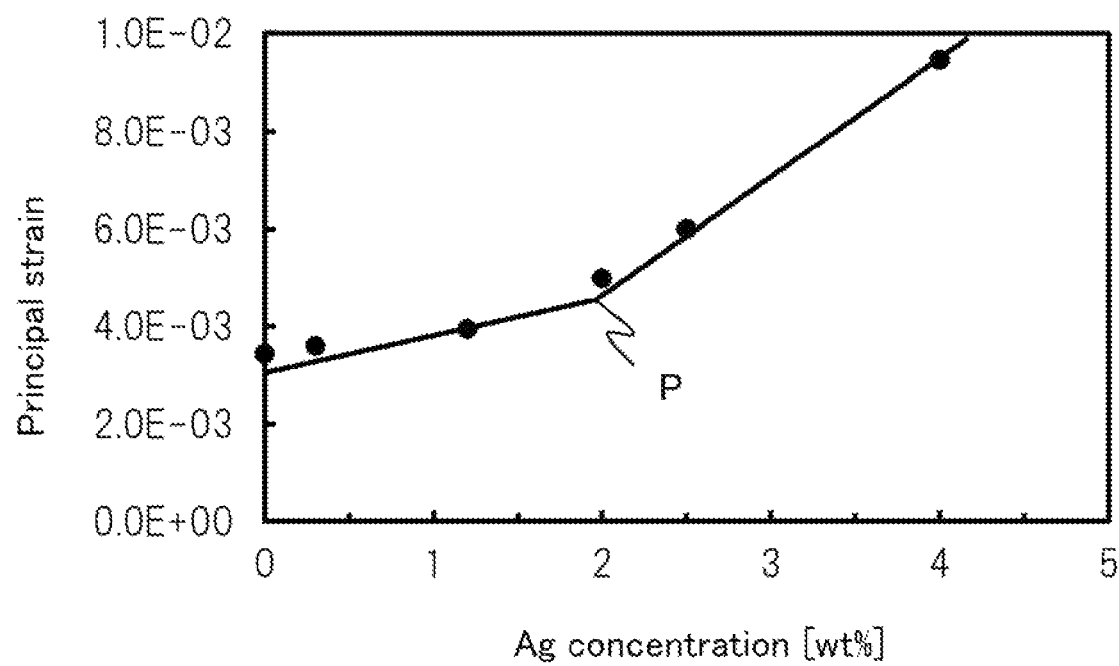
FIG. 15 is a graph for explaining a condition of the principal strain of the metal film depending on an Ag concentration in the solder used for the semiconductor device according to Embodiment 1.

The Al metal film 3c is provided between the Si semiconductor element 3a and the Ni metal film 3d for the chip 3 to be bonded with the chip-top solder 6. FIG. 15 shows a calculation result of the principal strain occurring in the Al metal film 3c when an Ag concentration containing in the chip-bottom solder 4 and chip-top solder 6 is varied. The calculation was carried out assuming that the Al metal film 3c and the Ni metal films 3b, 3d each had 5 μm thickness and the 0.2% proof stress of the solder was 20 MPa to 35 MPa calculated from an actual measurement value. Since the Ag concentration in excess of 2 wt. % (the region D in FIG. 5) hardens the solder (Condition S91) and the 0.2% proof stress of the chip-bottom solder 4 and the chip-top solder 6 exceeds that of Al, the strain rapidly increases as indicated by the point P in FIG. 15. Occurrence of a thermal stress (Condition S92) generates a crack in the Al metal film 3c prior to the solders. This raises concern about breakage of the chip 3 (Condition S93). Hence, since in a case of the Ag concentration being more than 2 wt. %, using Al for the metal film 3c on the front face of the chip 3 possibly generates a crack in the Al metal film 3c, the Ag concentration is preferably 2 wt. % or less. Considering variation in the 0.2% proof stress of the solders, the Ag concentration is preferably 1.2 wt. % of less, thereby being able to stably provide a semiconductor device having a more excellent reliability. Note that when Al is not used for the metal film 3c on the front face of the chip 3 or a material having a 0.2% proof stress smaller than that of the solder is not used, the Ag concentration may be maintained in a range of 3 wt. % or less that can prevent occurrence of a shrinkage cavity.

Thus, using the chip-bottom solder 4 and the chip-top solder 6 both having the composition containing Sn, 0.3-2 wt. % Ag, and 0.5-1 wt. % Cu allows for preventing not only a shrinkage cavity but also separation due to loss of Ni during the heat cycles and for preventing strain imposed to the Al metal layer 3c, thus providing a module that exhibits an excellent reliability and is reduced in size due to low heat resistance. Moreover, by using the chip-bottom solder 4 and the chip-top solder 6 having the same composition, the manufacturing becomes easy to control.

Furthermore, since both solders have the same melting point, the components on and under the chip can be bonded by the same soldering machine under the same temperature profile.

Figure 16A:
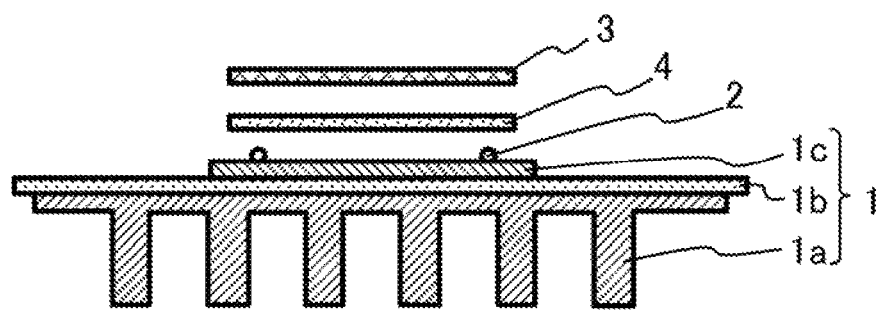
FIGS. 16A, 16B and 16C are schematic cross-sectional views illustrating steps for producing the semiconductor device according to Embodiment 1.
Figure 16B:
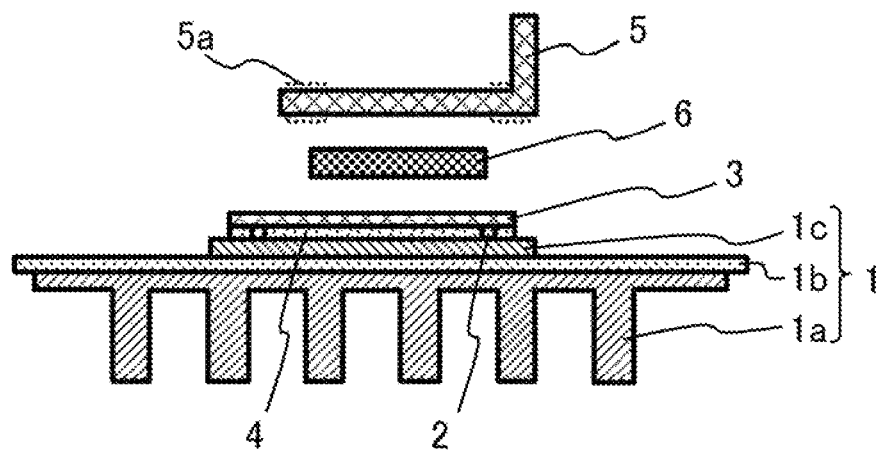
Figure 16C:
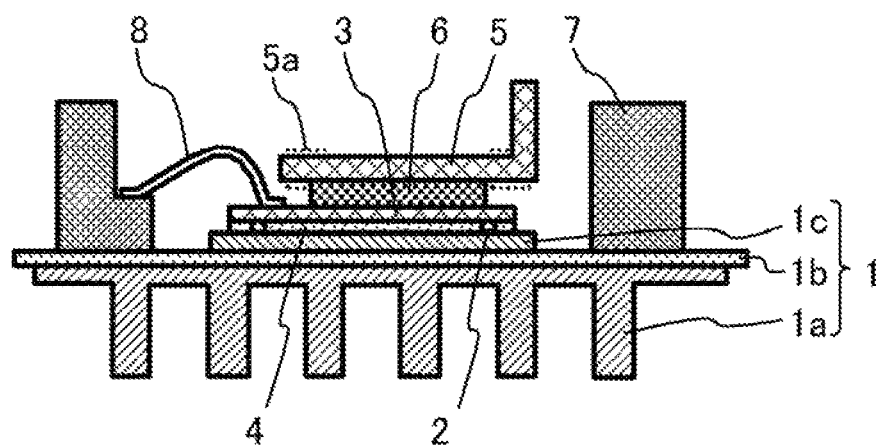

Next, a method for producing the semiconductor device 101, according to Embodiment 1 is described. FIGS. 16A, 16B, 16C are cross-sectional views for explaining a fabrication process of the semiconductor device 101.

First, the insulating substrate 1 integrated with the cooling fin 1a is prepared, and then the spacer 2 of Al wire are disposed at the four corners of an area for placing the chip 3 on the electrode pattern 1c of the insulating substrate 1, as shown in FIG. 16A. Then, the chip-bottom solder 4 (Sn, 0.3-2 wt. % Ag, and 0.5-1 wt. % Cu) and the chip 3 are placed and bonding is performed by reflow.

Subsequently, the chip-top solder 6 (Sn, 0.3-2 wt. % Ag, and 0.5-1 wt. % Cu) and the plate interconnection member 5 are placed on the chip 3 as shown in FIG. 16B, and then bonded by reflow. In the case of mounting the plurality of chips 3, the multiple plate interconnection members 5 beforehand joined into one piece with the resin connecting members 5a may be used.

Next, the casing 7 is attached with adhesive so as to enclose the chip 3 die-bonded to the insulating substrate 1, and then the wires 8 are connected as signal lines by wire-bonding between the chip 3 and the externally connected terminal (not shown) on the casing 7, as shown in FIG. 16C. In addition, bonding of the casing 7 is completed by heating during the reflow. The bonding of the casing 7 to the insulating substrate 1 may be concurrently completed by the reflow for the solder 4 or the solder 6, or may be completed in another step other than the reflow step for the solder. Using the chip-bottom solder 4 and the chip-top solder 6 both containing Sn, 0.3-3 wt. % Ag, and 0.5 to 1 wt. % Cu allows the solder bonding to be performed at a temperature not melting the casing 7, and enables the soldering and the bonding of the casing 7 to be performed at one time. Using such a solder is preferable because the bonding process can be simplified. Moreover, using such a solder is also preferable for the case of joining beforehand the multiple plate interconnection members 5 to each other because the solder can be melted at a temperature lower than the upper temperature limit of the resin connecting members 5a.

Finally, the sealing resin is poured into the casing to form the resin sealing portion 9 by curing. The semiconductor device 101 such as shown in FIG. 2 is thereby completed.

While AlN is used for the ceramic base plate of the insulating substrate 1, $Al_2O_3$, $SI_3N_4$ ceramic, or the like may be used therefor as long as they ensure insulation, and their size and thickness are not limited to those described above. While an Al wire is used as the wire spacers 2, a Cu wire or other wire may be used. Moreover, while the wire spacers 2 have a diameter of 100 μm, the diameter may be smaller than the solder thickness. Further, a solder containing Ni balls may be used because the minimum solder thickness can be ensured. While the insulating substrate 1 is formed by beforehand integrating the ceramic base plate 1b and the cooling fin 1a by casting, the ceramic base plate and the cooling fin may be beforehand integrated by brazing or soldering. The integration by casting or brazing is preferable because a solder, which has a low thermal conductivity, is not used and heat resistance can thereby be lowered. Further, a material of the insulating member is not limited to ceramic but may be other material as long as it ensures insulation, for example, a laminated resin sheet may be available. Hence, the insulating substrate 1 may also be formed by integrating the cooling fin 1a and an insulating member such as an insulating sheet or an insulating film.

While the Ni metal films 3b and 3b of 5 μm thickness is provided on the to-be-soldered faces of the chip 3 to ensure solderability, metal films such as of Au or Ti may be available and their thickness is not limited to that as long as soldering can be accomplished. In addition, the Ni metal films 3b, 3d each may be formed at a one portion or two more portions on the chip 3.

Figure 17A:
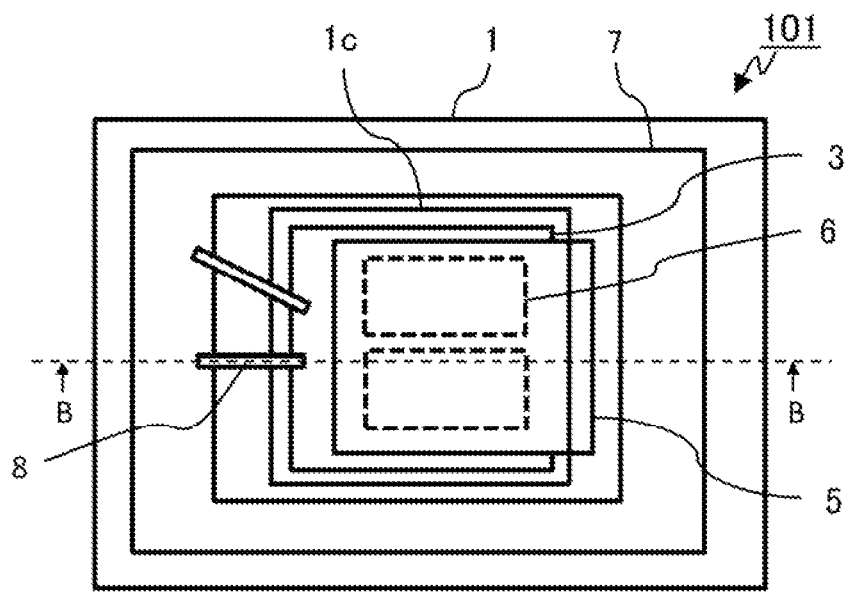
FIGS. 17A and 17B are schematic plan view and a cross sectional view, respectively, showing another configuration of the main portion of the semiconductor device according to Embodiment 1.
Figure 17B:
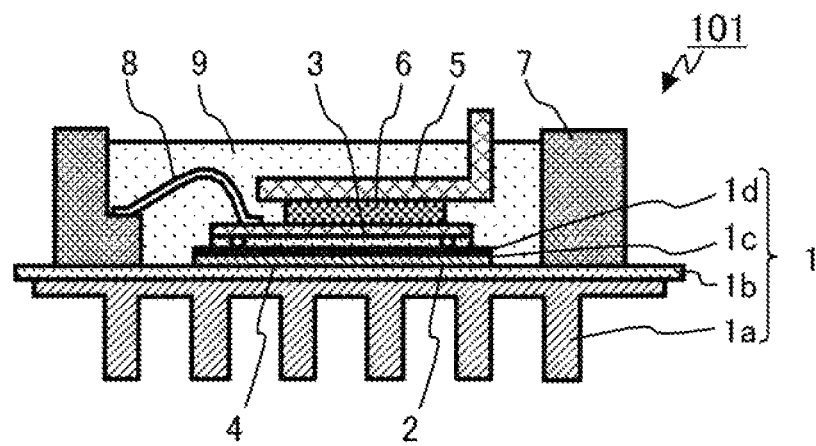

While an IGBT is used as the semiconductor element 3a, the element may be an integrated circuit (IC), a thyristor, or a metal oxide semiconductor field effect transistor (MOSFET). Furthermore, the element may be a rectifier element such as a Schottky barrier diode (SBD) or a junction barrier Schottky (SBJ) and may be applied to a semiconductor package other than a semiconductor device. In addition, the size and thickness of the semiconductor element are not limited to those of the above-mentioned IGBT. As shown in FIGS. 17A and 17B, the semiconductor device may have one chip and correspondingly have one interconnection member.

While the Si semiconductor element 3a is used, a so-called wide-bandgap semiconductor material such as silicon carbide (SiC), gallium nitride (GaN) based material, or diamond has a wider bandgap compared to silicone can be used for the semiconductor element. The semiconductor device 101, when having the semiconductor elements formed of such a wide-bandgap semiconductor material and capable of a high allowable current operation and high temperature operation, exhibits a particularly considerable effect in the above operation.

Since power loss of a switching element and a rectifier element formed of the wide-bandgap semiconductor element is lower than that of such an element formed of silicon, the switching element and the rectifier element can achieve increased efficiency, and by extension, a power semiconductor device using the element can bring about a high efficiency. Furthermore, since the wide-bandgap switching and the rectifier elements have a high breakdown voltage and also a high allowable current density, they can be reduced in size. Accordingly, using these small sized switching element and rectifier element allows the power semiconductor device also to be made compact or a further high current operation to be performed. Moreover, since they have a high heat resistance, a high temperature operation can be achieved and this allows a radiating fin (cooler) mounted in a heatsink to be reduced in size and the water cooler unit to be also changed to air cooling, the power semiconductor device can achieve further reduction in size and perform a high current operation.

While the plate interconnection 5 is formed of Cu, another material such as Al may be used. A clad material formed by bonding multiple metals such as invar and the like may also be used. The plate interconnection may be coated with a metal film such as Ni or Au, and its thickness in not limited to 1 mm.

While the connecting member 5a is formed of PPS, a material such as polybutylene terephthalate (PBT) may also be used if the material is not deformed at a high temperature during the reflow. If the interconnection members 5 can be joined into one piece, the connecting members 5a may be disposed at one location or multiple locations between each of the multiple plate interconnection members 5. While the interconnection members are positioned with the positioning pins, the electrode pattern 1c of the insulating substrate 1 may be utilized instead of the pins. While the connecting members 5a are formed by an inset molding, it may be formed using a method of joining into one piece by press-inserting a metal into a molded resin.

Figure 18A:
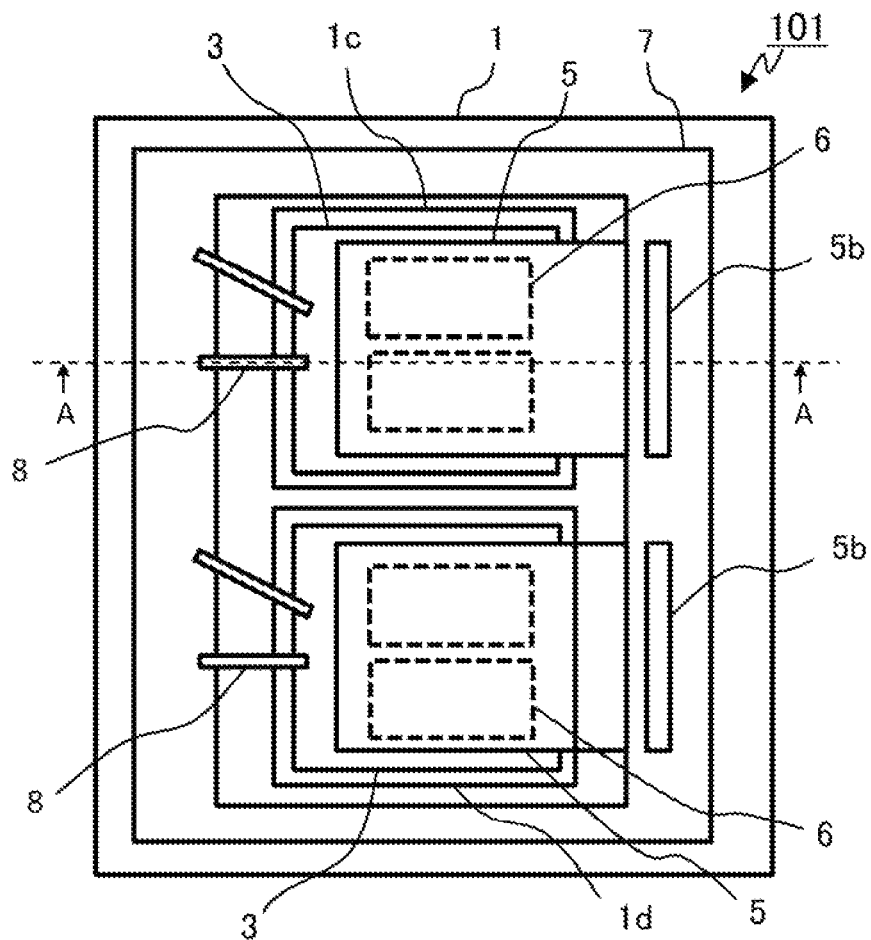
FIGS. 18A and 18B show a schematic plan view and a cross-sectional view, respectively, showing still another configuration of the main portion of the semiconductor device according to Embodiment 1.
Figure 18B:
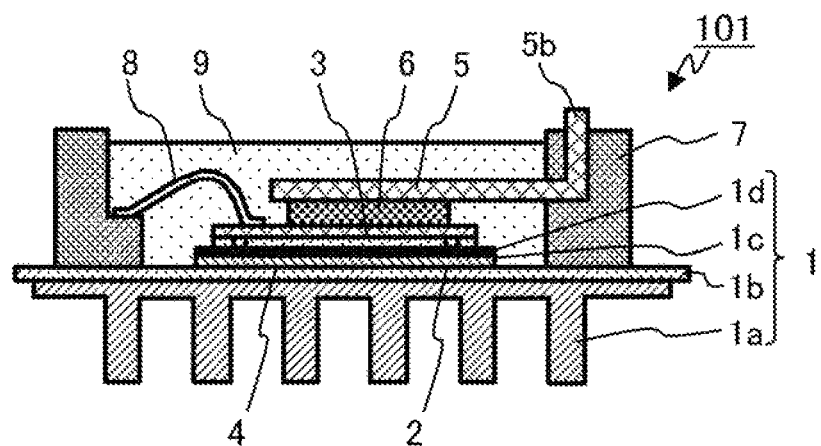

While the multiple interconnection members 5 are joined into one piece with the connecting members 5a, the casing 7 is formed, as shown in FIGS. 18A and 18B, to have a structure serving also as a connecting member for the interconnection members 5, to fasten the external electrodes 5b of the interconnection members 5. This allows the number of parts to be further reduced.

The casing 7 may be formed of polybuthylene terephthalate (PBT) or the like if it does not deform at a high temperature during the reflow. While the casing is formed by insert molding, it may be formed using a method of joining into one piece by press-inserting a metal into a molded resin.

The wire 8 is not limited to use in the gate wiring but may be used in wiring for emitter sense or a temperature sensing diode. And, its material is not limited to Al but may be other material such as Cu. In addition, the diameter of the wires 8 is not limited to 200 μm. Further, not a wire but a plate interconnection member may be soldered as the wires 8.

While the resin sealing portion 9 is formed of epoxy resin, a resin material is not limited to epoxy resin but silicone gel or the like may be used as long as it ensures insulation. The bonding by the chip-bottom solder 4 and the chip-top solder 6 is performed by one time reflow.

As described above, the semiconductor device 101 according to Embodiment 1 includes the insulating substrate 1 formed by integrating the ceramic base plate 1b and the cooling fin 1a; the multiple plate-interconnection members 5 joined to each other with the resin connecting members 5a; and the plurality of semiconductor elements 3a whose one faces are bonded with the chip-bottom solder 4 to the ceramic base plate 1b of the insulating substrate 1 and whose other faces are respectively bonded with the chip-top solder 6 to the corresponding multiple plate-interconnection members 5, and the chip-bottom solder 4 and the chip-top solder 6 both contains mainly Sn and 0.3-3 wt. % Ag and 0.5-1 wt. % Cu. This can prevent occurrence of a shrinkage cavity and can thereby reduce the size of the semiconductor device without impairing heat dissipation. Moreover, since separation due to loss of Ni during the temperature cycle can be prevented and strain imposed to the Al metal film can be prevented, the module has an excellent reliability and a low heat resistance, thereby being able to provide the module reduced in size. Furthermore, by using the chip-bottom solder 4 and the chip-top solder 6 having the same composition, the manufacturing becomes easy to control. Still further, since both solders have the same melting point, the components on and under the chip can be bonded by the same soldering machine under the same temperature profile.

Further, since the insulating substrate 1 is formed by integrating the ceramic base plate 1b and the cooling fin 1a, heat resistance can be more reduced than the case of putting the fin in contact with the substrate via grease, thereby being able to reduce the size of the module. Still further, since the interconnecting on the chip 3 is established by soldering the plate interconnection member 5, the current density can be increased and the module can be reduced in size in comparison with the case of using wire-bonding.

Further, since the multiple plate-interconnection members are beforehand joined in series into one piece with the resin connecting members 5a, the number of positioning pins can be reduced, thus being able to reduce in size accordingly. Still further, since the insulating substrate 1 and the semiconductor element 3a are soldered with the spacers 2 being interposed therebetween, the minimum solder thickness can be ensured and heat dissipation can be prevented from being impaired by occurrence of unevenness in thickness of the solder.

Further, in the case of using Al for the metal film on the front face of the chip 3, since the solder containing mainly Sn and 0.3-2 wt. % Ag and 0.5-1 wt. % Cu is used for the chip-top solder 6, the same effect as above can be brought about. Similarly, in the case of using Al for the metal film on the back face of the chip 3, the solder containing mainly Sn and 0.3-2 wt. % Ag and 0.5-1 wt. % Cu is used for the chip-bottom solder 4, the same effect as above can also be brought about.

Embodiment 2

While Embodiment 1 describes the fabrication of the semiconductor device using the chip-bottom solder 4 and the chip-top solder 6 containing mainly Sn and 0.3-3 wt. % Ag and 0.5-1 wt. % Cu, Embodiment 2 describes a fabrication of a semiconductor device using a solder containing mainly Sn and 0.5-1 wt. % Cu only.

A semiconductor device 102 according to Embodiment 2 is fabricated using a solder containing mainly Sn and 0.5-1 wt. % Cu as both of the chip-bottom solder 4 and the chip-top solder 6. Moreover, an Ag metal film is used for the metal film 3d over the front face of the chip 3, and the metal film 3b on the back face thereof or the metal film 1d on the front face of the electrode pattern 1c of the insulating substrate 1. The configuration of the fabricated semiconductor device of Embodiment 2 except for the metal film 3d, and the metal film 3b or the metal film 1d is the same as that of the semiconductor device of Embodiment 1; hence, the drawings used in Embodiment 1 are applied to Embodiment 2 and the description of the same parts is omitted.

In a semiconductor device fabrication process in Embodiment 2, when the solders are melted by heating during the reflow step shown in FIG. 16B, Ag is solved into the chip-bottom solder 4 from the metal films 3b bonded thereto and into the chip-top solder 6 from 3d or 1d bonded thereto, whereby Ag concentrations in both of the chip-bottom solder 4 and the chip-top solder 6 become 0.3-2 wt. %. A fabrication method for the semiconductor device 102 in Embodiment 2 is the same in the other steps as that for the semiconductor device 101 in Embodiment 1; hence, the drawings used in Embodiment 1 are applied and the description of the same steps is omitted.

As described above, the method for producing the semiconductor device 102 according to Embodiment 2 includes a step of bonding, with the chip-bottom solder 4 through the first reflow, the metal films 3b on the back faces of the plurality of semiconductor elements 3a to the metal films 1d on the front faces of the electrode patterns 1c on the front face of the ceramic base plate 1b of the insulating substrate 1 formed by integrating the ceramic base plate 1b and the cooling fin 1a and a step of bonding, with the chip-top solder 6 through the second reflow, the multiple plate interconnection members 5 respectively corresponding to the semiconductor elements 3a to the metal films 3d formed over the front faces of the plurality of semiconductor elements 3a. By using the chip-bottom solder 4 and the chip-top solder 6 both containing mainly Sn and 0.5-1 wt. % Cu, and by forming of Ag the metal films 3d over the front faces of the plurality of semiconductor elements 3a and by forming of Ag either the metal films 3b on the back faces of the plurality of semiconductor elements 3a or the metal films 1d on the front face of the electrode patterns 1c on the front face of the ceramic base plate 1b of the insulating substrate 1, the chip-bottom solder 4 and the chip-top solder 6 both become a solder containing mainly Sn and 0.3-3 wt. % Ag and 0.5-1 wt. % Cu through each reflow steps. This allows not only the fabricated semiconductor device to exhibit the same effect as with Embodiment 1 but also the solders to be obtained at a low cost.

In addition, in a case of changing the metal film 3d, and the metal film 3b or the metal film 1d each formed of Ag to those formed of Cu, using a solder containing mainly Sn and 0.3-2 wt. % Ag as both the chip-bottom solder 4 and the chip-top solder 6 can also bring about the same effect.

Furthermore, the metal film 3d, and the metal film 3b or the metal film 1d each formed of Ag or Cu may be in a form of plating, or either powder or paste, whereby the same effect can also be brought about.

In a case of forming of Al the metal film on the front face of the chip 3, since a solder containing mainly Sn and 0.3-2 wt. % Ag and 0.5-1 wt. % Cu is used as the chip-top solder 6, the same effect can be brought about. Similarly, in a case of forming of Al the metal film on the back face of the chip 3, since a solder containing mainly Sn and 0.3-2 wt. % Ag and 0.5-1 wt. % Cu is used as the chip-bottom solder 4, the same effect can also be brought about.

The metal films 3b and 3d both are not necessarily formed of Ag. Only the metal 3b may be formed of Ag or only the metal film 3d may be formed of Ag. Similarly, the metal films 3b and 3d both are not necessarily formed of Cu. Only the metal 3b may be formed of Cu or only the metal film 3d may be formed of Cu.

Embodiment 3

While Embodiment 2 describes the case of placing the semiconductor element directly on the electrode pattern 1c of the substrate 1 to be bonded with the chip-bottom solder 4 and the chip-top solder 6 containing mainly Sn and 0.3-2 wt. % Ag, Embodiment 3 describes a case of forming a resist over an area on the electrode pattern 1c other than the area for placing the semiconductor element 3a.

Figure 19:
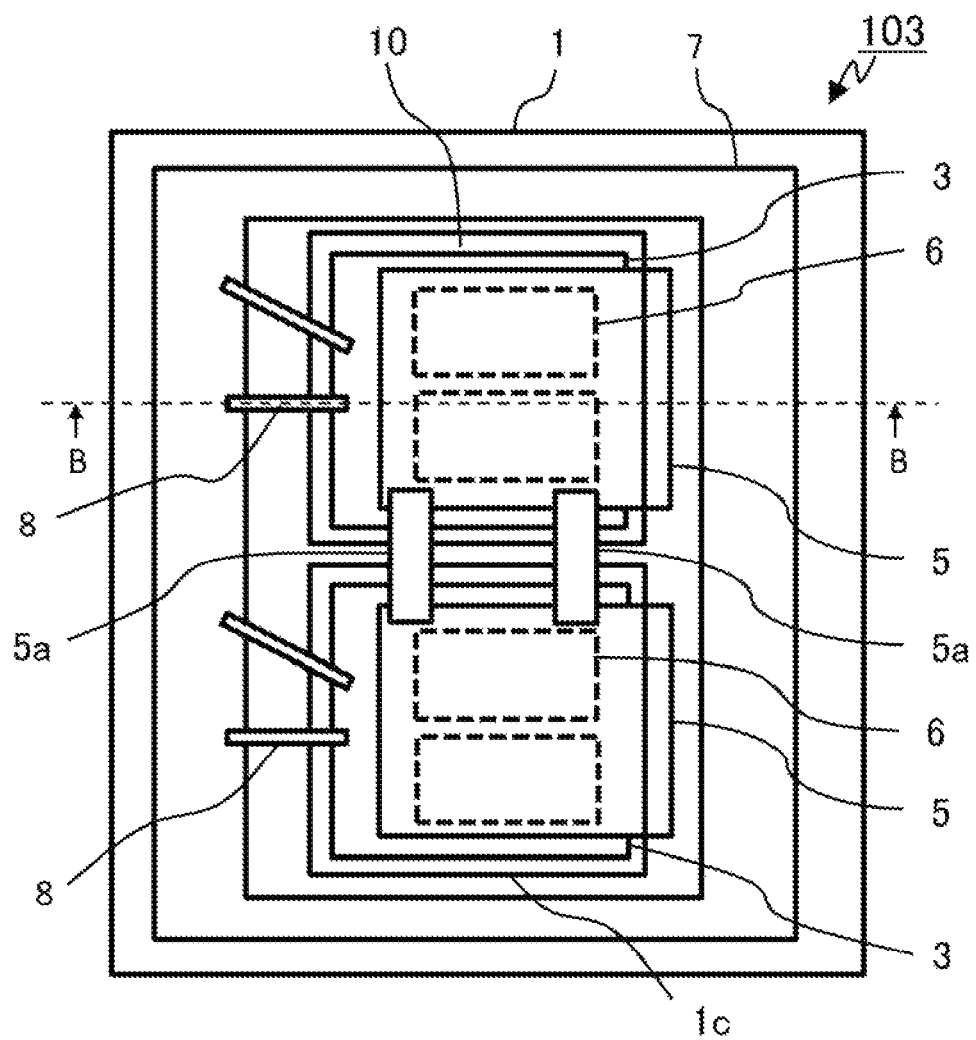
FIG. 19 is a schematic plan view showing a configuration of the main portion of a semiconductor device according to Embodiment 3.
Figure 20:
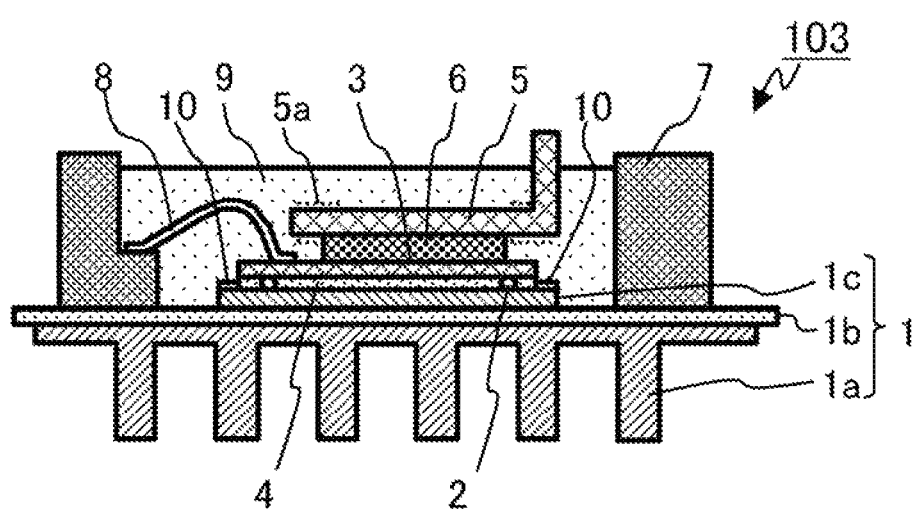
FIG. 20 is a schematic cross-sectional view showing a configuration of the main portion of the semiconductor device according to Embodiment 3.

FIG. 19 is a top plan view of a semiconductor device 103 according to Embodiment 3. FIG. 20 is a cross-sectional view taken in the direction of Arrows B-B in FIG. 19. As shown in FIGS. 19 and 20, in the semiconductor device 103, the semiconductor element 3a is bonded with the chip-bottom solder 4 after the resist 10 of polyimide or the like is formed over the area other than the area for placing the semiconductor element 3a on the metal film 1d on the front face of the electrode pattern 1c in the case, among those in Embodiment 2, of forming the metal film 1d of Cu on the front face of electrode pattern 1c on the ceramic base plate 1b of the insulating substrate 1 and of using the chip-bottom solder 4 containing mainly Sn and 0.3-2 wt. % Ag. The other configuration of and a fabrication method for the semiconductor device 103 according to Embodiment 3 are the same as the configuration of and the fabrication method for the semiconductor device 102 according to Embodiment 2 for the case of forming the metal film 1d of Cu on the electrode pattern 1c being formed; hence, the drawings used in Embodiment 1 are applied and the description of the same parts is omitted.

As described above, according to the fabrication method for the semiconductor device 103 of Embodiment 3, in the case of the metal film 1d on the front face of the electrode pattern 1c being formed of Cu, since the bonding is performed with the chip-bottom solder 4 after the resist 10 is formed over the area other than that for placing the semiconductor element 3a on the metal film 1d on the front face of the electrode pattern 1c, the fabricated semiconductor device not only exhibits the same effect as that of Embodiment 1 but also can prevent the wetting region of the chip-bottom solder from spreading.

While the Al cooling fin 1a is used in the above embodiments, a cooling fin is not limited to this. For example, using a Cu cooling fin can enhance heat dissipation.

While the interconnection member is bonded by the chip-top solder through the second reflow, the soldering may be performed by local heating using a laser. While the chip and the substrate are coated with the metal film such as of Ni to ensure good solderability, a metal such as Ni diffuses into the solder during melting of the solder. Excessive diffusion of the metal such as Ni during the second reflow changes the solder composition to that not effective to occurrence of shrinkage cavity. In contrast to this, local heating using a laser can prevent such diffusion because of no melting of the chip-bottom solder. Moreover, although a void may sometimes occur due to close of an open end portion of a shrinkage cavity occurred during the first reflow, no such a void occurs because of no melting of the chip-bottom solder.

Since the laser local heating allows the chip-bottom solder to be prevented from remelting, a defect such as a void and a shrinkage cavity can be inspected under a condition without the interconnection member. When the interconnection member is formed of Cu, since its X-ray transmittance is substantially the same as that of the solder, a CT scan or visual observation is required to inspect perform the inspection under a soldered condition of the Cu interconnection members. On the other hand, performing the inspection under a condition before the interconnection member is soldered can reduce inspection hours because a standard X-ray equipment is available.

Rapidly heating a chip restrained by soldering to a soldering temperature may sometimes be damaged by thermal stress caused by the difference between linear expansion coefficients of a substrate and the chip. Since the laser local heating heats only region to be bonded by the chip-top solder, the influence of thermal stress due to difference in linear expansion coefficient between the substrate and the chip can reduced and breakage of the chip can thereby be prevented.

If only soldering region of the chip-top solder and the interconnection member can be heated, contacting a heated metal such as a soldering iron may be employed as a bonding method.

While the present application describes the various exemplar embodiments and examples, various features and aspects and functions described in one embodiment or the plurality of embodiments are not limited to application to a specific embodiment but can be applied to the embodiments in a single form or in various combinations. Therefore, innumerable non-exemplified modifications are conceivable within the technical scope disclosed in the specification of the present application. The modifications shall include, for example, a modifying at least one of the constituent elements or a appending least one of constituent elements or omitting least one of the constituent elements, or further extracting at least one of the constituent elements and combining it with constituent elements of other embodiment.

REFERENCE NUMERALS

1: insulating substrate;
1a: cooling fin;
1b: ceramic base plate;
1c: electrode pattern;
1d: metal film;
2: spacers;
3: chip;
3a: semiconductor element;
3b, 3c, 3d: metal film;
4: chip-bottom solder;
5: interconnection(s);
6: chip-top solder;
10: resist; and
101, 102, 103: semiconductor device.

The invention claimed is:

1. A semiconductor device comprising:
   a substrate formed by integrating an insulating member and a cooling fin;
   a plate interconnection member; and
   a semiconductor element whose back face is bonded with a first solder to interconnection pattern formed on the insulating members of the substrate and whose front face is bonded to the plate interconnection member with a second solder so that the plate interconnection member correspond to the semiconductor element,
   wherein the first solder contains mainly Sn, 0.3-3 wt. % Ag and 0.5-1 wt. % Cu, and
   wherein when Al metal film is formed on the front face of the semiconductor element, the second solder contains mainly Sn, 0.3-2 wt. % Ag and 0.5-1 wt. % Cu.

2. The semiconductor device according to claim 1, wherein when Al metal film is formed on the back face of the semiconductor element, the first solder contains mainly Sn, 0.3-2 wt. % Ag and 0.5-1 wt. % Cu.

3. The semiconductor device according to claim 1, wherein the substrate and the semiconductor element is bonded, with spacer being sandwiched between the substrate and the semiconductor element.

4. The semiconductor device according to claim 1, wherein when the semiconductor device has plural semiconductor elements each being said semiconductor element, plural plate interconnection members each being said plate interconnection member are formed so as to correspond to the plurality of semiconductor elements, and a first plate interconnection member and a second plate interconnection member being said plate interconnection members are joined to each other with a resin connecting member.

5. The semiconductor device according to claim 1, wherein the substrate is formed by integrating the insulating member and the cooling fin by casting.

6. The semiconductor device according to claim 1, wherein the substrate is formed by integrating the insulating member and the cooling fin by brazing.

7. The semiconductor device according to claim 1, wherein the semiconductor element is formed of a wide-bandgap semiconductor material of either silicon carbide, gallium nitride based material, or diamond.

8. A semiconductor device comprising:
a substrate formed by integrating an insulating member and a cooling fin;
a plate interconnection member; and
a semiconductor element whose back face is bonded with a first solder to interconnection pattern formed on the insulating member of the substrate and whose front face is bonded to the plate interconnection member with a second solder so that the plate interconnection member correspond to the semiconductor element,
wherein the first solder contains mainly Sn, 0.3-2 wt. % Ag and 0.5-1 wt. % Cu,
wherein the substrate is provided with metal film formed on the interconnection pattern on the insulating member bonded to the back face of the semiconductor element with the first solder via the metal film, and the semiconductor element is provided with metal film formed on the back face bonded to the insulating member with the first solder via the metal film, and
wherein at least either one of the metal film on the back face of the semiconductor element and the metal film on the interconnection pattern on the insulating member is formed of Ag or Cu.

9. The semiconductor device according to claim 8, wherein the second solder contains mainly Sn, 0.3-3 wt. % Ag and 0.5-1 wt. % Cu.

10. The semiconductor device according to claim 8, wherein the semiconductor element is provided with metal film formed on the front face of the semiconductor element bonded to the plate interconnection member with the second solder via the metal film, and the metal film on the front face of the semiconductor element is formed of Ag or Cu.

11. A method for producing the semiconductor device comprising the steps of:
bonding back face of semiconductor element, with a first solder through a first reflow, to interconnection pattern on an insulating member of a substrate formed by integrating the insulating member and a cooling fin; and
bonding plate interconnection member to front face of the semiconductor element with a second solder through a second reflow so that the plate interconnection member correspond to the semiconductor element,
wherein the first solder contains mainly Sn, 0.3-3 wt. % Ag and 0.5-1 wt. % Cu, and
wherein when Al metal film is formed over the front face of the semiconductor element, the second solder contains mainly Sn, 0.3-2 wt. % Ag and 0.5-1 wt. % Cu.

12. The method for producing the semiconductor device according to claim 11, wherein when Al metal film is formed on the back face of the semiconductor element, the first solder containing mainly Sn, 0.3-2 wt. % Ag and 0.5-1 wt. % Cu.

13. The method for producing the semiconductor device according to claim 11, wherein when the semiconductor device has plural semiconductor elements each being said semiconductor element, plural plate interconnection members each being said plate interconnection member are formed so as to correspond to the plurality of semiconductor elements, and a first plate interconnection member and a second plate interconnection member being said plate interconnection members are joined to each other with a resin connecting member.

14. The method for producing the semiconductor device according to claim 11, wherein the step of bonding with the first solder and the step of bonding with the second solder are executed at the same time.

15. The method for producing the semiconductor device according to claim 11, wherein the step of bonding with the first solder is executed simultaneously with a step of bonding a casing to the substrate.

16. The method for producing the semiconductor device according to 32, wherein in the step of bonding with the second solder, the bonding is performed by a local heating using a laser instead of the bonding by the second reflow.

17. A method for producing the semiconductor device comprising the steps of:
bonding metal film formed on back face of semiconductor element, with a first solder through a first reflow, to metal film formed on interconnection pattern on an insulating member of a substrate formed by integrating the insulating member and a cooling fin; and
bonding metal film formed over front face of the semiconductor element, with a second solder through a second reflow, to plate interconnection member so that the plate interconnection member correspond to the semiconductor element,
wherein at least either one of the metal film on a back face of semiconductor element and the metal film formed on the interconnection pattern on the insulating member of the substrate is formed of Ag, and a solder containing mainly Sn and 0.5-1 wt. % Cu is used as the first solder so that the first solder becomes a solder containing mainly Sn, 0.3-3 wt. % Ag and 0.5-1 wt. % Cu during the first reflow in the step of bonding with the first solder.

18. A method for producing the semiconductor device comprising the steps of:
bonding metal film formed on a back face of semiconductor element, with a first solder through a first reflow, to metal film formed on interconnection pattern on an insulating member of a substrate formed by integrating an insulating member and a cooling fin; and
bonding plate interconnection member, with a second solder through a second reflow, to metal film formed over front face of the semiconductor element so that the plate interconnection member correspond to the semiconductor element,
wherein at least either one of the metal film on a back face of semiconductor element and the metal film formed on the interconnection pattern on the insulating member of the substrate is formed of Cu, and a solder containing mainly Sn and 0.3-3 wt. % Ag is used as the first solder so that the first solder becomes a solder containing mainly Sn, 0.3-3 wt. % Ag and 0.5-1 wt. % Cu during the first reflow in the step of bonding with the first solder.

19. A semiconductor device comprising:
a substrate integrated with an insulating member and a cooling fin;
a plate interconnecting member; and
a semiconductor element whose back face is bonded with a first solder to interconnection pattern formed on the insulating member of the substrate and whose front face is bonded to the plate interconnection member with a second solder so that the plate interconnection member correspond to the semiconductor element,
wherein when Al metal film is formed on back face of the semiconductor element, the first solder contains mainly Sn, 0.3-2 wt. % Ag and 0.5-1 wt. % Cu.

20. A semiconductor device comprising:
a substrate integrated with an insulating member and a cooling fin;
a plate interconnecting member; and
a semiconductor element whose back face is bonded with a first solder to interconnection pattern formed on the insulating member of the substrate and whose front face is bonded to the plate interconnection member with a second solder so that the plate interconnection member correspond to the semiconductor element,
wherein when Al metal film is formed on the front face of the semiconductor element, the second solder contains mainly Sn, 0.3-2 wt. % Ag and 0.5-1 wt. % Cu.

\* \* \* \* \*